United States Patent
Kono

(10) Patent No.: US 6,232,664 B1
(45) Date of Patent: May 15, 2001

(54) SEMICONDUCTOR DEVICE HAVING Al ALLOY WIRING

(75) Inventor: Takahiro Kono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/227,263

(22) Filed: Jan. 8, 1999

(30) Foreign Application Priority Data

May 28, 1998 (JP) .................................................. 10-148010

(51) Int. Cl.[7] .................................................. H01L 23/48
(52) U.S. Cl. .................... 257/761; 257/758; 257/750; 257/774
(58) Field of Search .................... 257/750, 751, 257/758, 759, 761, 765, 774

(56) References Cited

U.S. PATENT DOCUMENTS

| 4,933,743 | * | 6/1990 | Thomas et al. | 357/71 |
|---|---|---|---|---|
| 4,985,750 | * | 1/1991 | Hoshino | 351/71 |
| 5,221,449 | * | 6/1993 | Colgan et al. | 204/192.15 |
| 5,281,485 | * | 1/1994 | Colgan et al. | 428/457 |
| 5,313,101 | * | 5/1994 | Harada et al. | 257/758 |
| 5,572,072 | * | 11/1996 | Lee | 257/751 |
| 5,712,509 | * | 1/1998 | Harada et al. | 257/758 |
| 6,028,359 | * | 2/2000 | Merchant et al. | 257/750 |
| 6,054,770 | * | 4/2000 | Toyoda et al. | 257/762 |
| 6,057,237 | * | 5/2000 | Ding et al. | 257/751 |

FOREIGN PATENT DOCUMENTS

| 3-248568 | 11/1991 | (JP) . |
|---|---|---|
| 4-35035 | 2/1992 | (JP) . |
| 4-318934 | 11/1992 | (JP) . |
| 7-240533 | 9/1995 | (JP) . |
| 8-19516 | 2/1996 | (JP) . |
| WO 92/07968 | 5/1992 | (WO) . |

OTHER PUBLICATIONS

S. Vaidya et al.; Thin Solid Films, 75 (1981) pp. 253–259.
H. Toyoda et al.; IEEE/IRPS, 1994, pp. 178–184.

* cited by examiner

*Primary Examiner*—Eddie C. Lee
*Assistant Examiner*—Lourdes Cruz
(74) *Attorney, Agent, or Firm*—Armstrong, Westerman, Hattori, McLeland & Naughton, LLP

(57) ABSTRACT

An interlayer insulation film is formed on a semiconductor substrate. A wiring is formed on a part of the surface area of the interlayer insulation film. This wiring has a laminated structure including two or more layers. That is, the wiring includes an underlayer or a first conductive layer which is made of Ta in an α phase, and an overlayer or a second conductive layer which is made of an Al alloy.

12 Claims, 5 Drawing Sheets

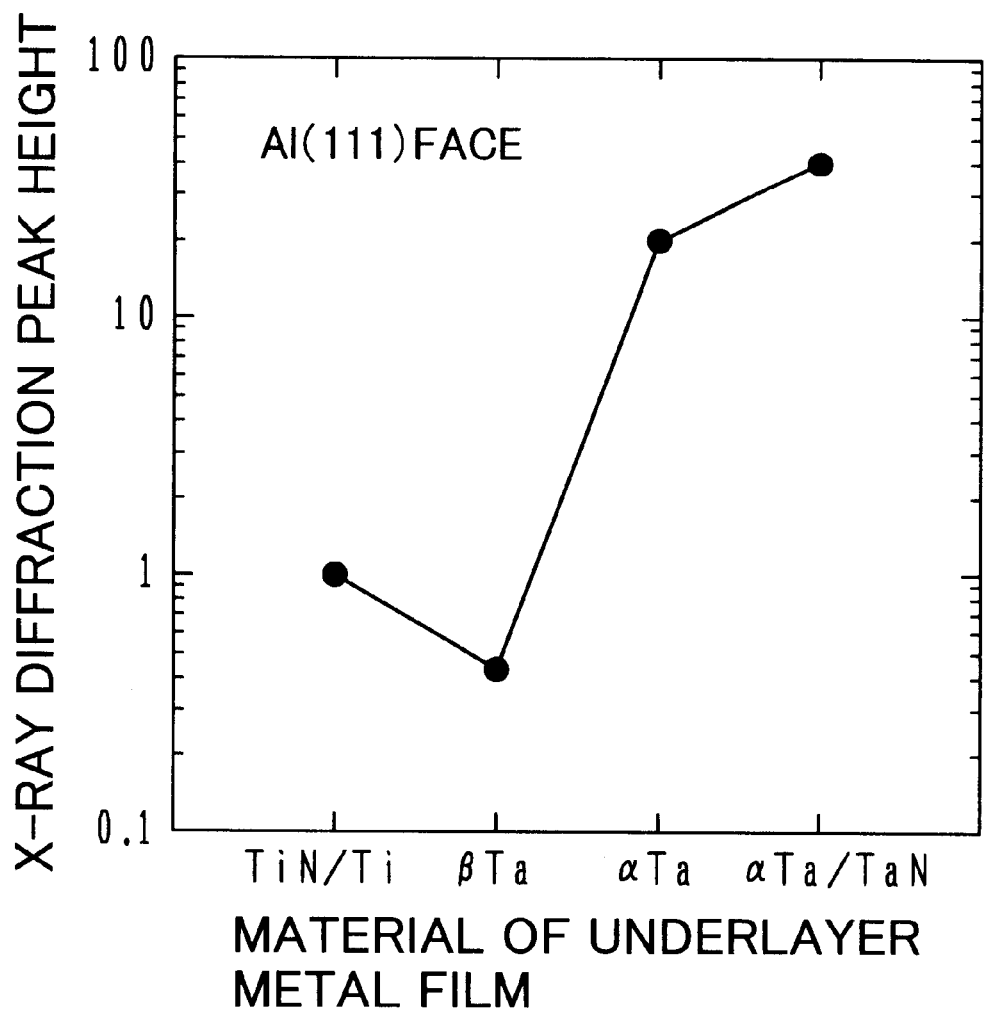

SEMICONDUCTOR DEVICE HAVING Al ALLOY WIRING

This application is based on Japanese Patent Application No. 10-148010 filed on May 28, 1998, the entire contents of which are incorporated herein by reference.

BACKGROUND OF THE INVENTION a) Field of the Invention

The present invention relates to a semiconductor device, and more particularly to a semiconductor device having an Al alloy wiring.

b) Description of the Related Art

A reduction in the resistance and capacitance of a metal wiring, as well as an improvement in its electromigration resistance, are required due to recent demands for a large scale integration and an increase in the operation speed of a semiconductor device. In order to satisfy these requirements, a wiring which includes a lamination of a Ti and/or TiN film and an Al alloy film is employed.

The stronger Al (111) oriented texture of the Al alloy film, the higher electromigration resistance of the Al alloy film (S. Vaidya and A. K. Sinha, Thin Solid Films, 75 (1981) 253–259). The method of laminating the Al alloy film on a refractory metal film, which is made of a Ta—Al alloy, has been proposed as a plan to strengthen the crystallographic orientation of the (111) face of the Al alloy film (H. Toyoda et al., Proceedings of 32nd International Reliability Physics Symposium, 178 (1994)). According to the Toyoda et al. document, when the Al alloy film is formed on the Ta—Al alloy film, the peak height derived as one corresponding to the (111) face from the X-ray diffraction pattern of the Al alloy film is about four times as great as that when the Al alloy film is formed on the TiN/Ti (TiN: the upper film, Ti: the lower film) film.

Now there is a tendency toward a reduction in the thickness of an Al alloy wiring in order to reduce wire capacitance, etc. If the wiring thickness is reduced, the current density in the wiring will increase, which entails the possibility that electromigration occurs. In consideration of this, a wiring structure having a high electromigration resistance is needed.

SUMMARY OF THE INVENTION

It is accordingly an object of the present invention to provide a semiconductor device with an Al alloy wiring having a high electromigration resistance.

According to one aspect of the present invention, there is provided a semiconductor device which comprises a semiconductor substrate, an insulation film formed on the semiconductor substrate, and a wiring formed on a part of the surface area of the insulation film and including a first conductive layer, which is made of Ta in an α phase, and a second conductive layer arranged on the first conductive layer and being made of an Al alloy.

When the second conductive layer, which is made of the Al alloy, is formed on the first conductive layer which is made of Ta in the α phase, the (111) face of the second conductive layer has a strong crystallographic orientation. This ensures a high electromigration resistance to the wiring.

BRIEF DESCRIPTION OF THE DRAWINGS

FIG. 1 is a graph showing the crystallographic orientation of the (111) face of the Al alloy film when a TiN/Ti laminated structure, a β-phase Ta film, an α-phase Ta film and an α-phase Ta/TaN laminated structure are adopted as an underlayer metal film;

DETAILED DESCRIPTION OF THE PREFERRED EMBODIMENTS

Figure 2A:
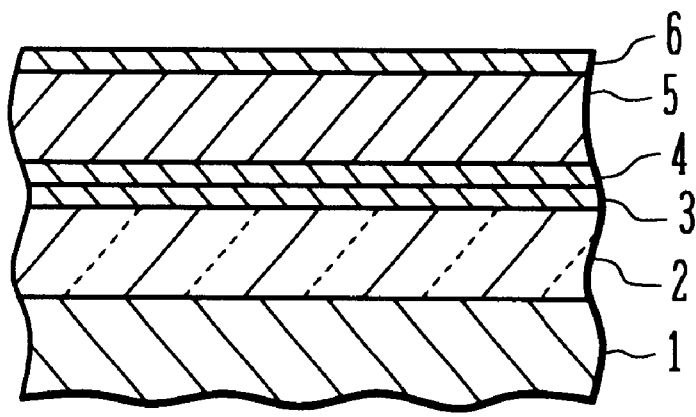
FIGS. 2A and 2B are diagrams illustrating cross sections of a wiring layer for the explanation of a method for manufacturing a wiring structure according to the first embodiment of the present invention.

The Al alloy film was grown on a variety of metal films employed as the underlayer, and its crystallographic orientation was evaluated. Firstly, the evaluation results will be described before explaining embodiments of the present invention. A TiN/Ti laminated structure (TiN: the upper film, Ti: the lower film), a Ta film in a β phase (hereinafter referred to as the β-phase Ta film), a Ta film in an α phase (hereinafter referred to as the α-phase Ta film) and an α-phase Ta/TaN laminated structure were prepared as the underlayer metal film. The evaluated Al alloy film comprised 0.5% Cu by weight. The Ta in the α phase had a body-centered cubic structure and belonged to a cubic system, while the Ta in the β phase belonged to a tetragonal system. An $SiO_2$ film was grown to a thickness of 100 nm on a silicon substrate, and the substrate having the $SiO_2$ film formed thereon was adopted as the underlying substrate.

The Ti film and the TiN film, included in the TiN/Ti laminated structure, were respectively 20 nm and 50 nm in thickness. The Ti film was deposited by way of the DC sputtering employing a Ti target and Ar gas, and the sputtering was carried out under the conditions of: a gas pressure of 3 mTorr and a sputtering power of 6 kW. The TiN film was deposited by way of the reactive DC sputtering employing a Ti target and a mixed gas of Ar and $N_2$, and the sputtering was effected under the conditions of: a gas pressure of 3 mTorr, the flow ratio of the Ar to the $N_2$ of 1:4 and a sputtering power of 12 kW.

The β-phase Ta film was 20 nm in thickness. The β-phase Ta film was deposited by the DC sputtering employing a Ta target and Ar gas, and the sputtering was carried out under the conditions of: a gas pressure of 3 mTorr and a sputtering power of 4 kW.

The α-phase Ta film was also 20 nm in thickness. The α-phase Ta film was formed in the following manner: a first Ta film, containing a very small amount of nitrogen, was deposited by performing for five seconds the DC sputtering employing a Ta target and a mixed gas of Ar and $N_2$, after which a second Ta film was deposited by way of the DC sputtering employing Ar gas only. The α-phase Ta film was obtained by thus depositing the second Ta film on the first Ta film containing a very small amount of nitrogen (Published Examined Japanese Patent Application No. Hei 8-19516). From the sheet resistance and the X-ray diffraction pattern of the α-phase Ta film, it was confirmed that this Ta film was in the α-phase. The conditions of the initial sputtering performed for five seconds were a gas pressure of 3 mTorr, a sputtering power of 2 kW and the flow ratio of the Ar to the $N_2$ of 4:1. The conditions of the later sputtering were a gas pressure of 3 mTorr and a sputtering power of 4 kW.

The TaN film and the α-phase Ta film, included in the α-phase Ta/TaN laminated structure, were respectively 10 nm and 20 nm in thickness. The TaN film was deposited by way of the reactive DC sputtering employing a Ta target and a mixed gas of Ar and $N_2$, and the sputtering was carried out under the conditions of: a gas pressure of 3 mTorr, the flow ratio of the Ar to the $N_2$ of 1:4 and a sputtering power of 4 kW. The α-phase Ta film was deposited by way of the DC sputtering employing a Ta target and Ar gas, and the sputtering was effected under the conditions of: a gas pressure of 3 mTorr and a sputtering power of 4 kW.

The Al alloy film was 400 nm in thickness. The Al alloy film was deposited by way of the DC sputtering employing an Al alloy target, which contained 0.5% Cu by weight, and Ar gas. The sputtering was performed under the conditions of: a gas pressure of 3 mTorr and a sputtering power of 12 kW. The deposition of the underlayer metal film and the Al alloy film was conducted through utilization of a vacuum convey multi-chamber system.

FIG. 1 is a graph showing the crystallographic texture of the Al (111) face which was analyzed by the X-ray diffraction of the Al alloy film. The vertical axis represents the relative values of the peak height corresponding to the Al (111) face. The peak height when the TiN/Ti laminated structure was used as the underlayer metal film is expressed as "1" in the graph.

The crystallographic orientation of the Al (111) face when the β-phase Ta film was used as the underlayer metal film was not greater than ½ that in the case where the TiN/Ti laminated structure was used as the underlayer metal film. In contrast, the crystallographic orientation of the Al (111) face when the α-phase Ta film was used as the underlayer metal film and that when the α-phase Ta/TaN laminated structure was used as the underlayer metal film were respectively nineteen times and thirty-eight times greater than that when the TiN/Ti laminated structure was used as the underlayer metal film.

As seen from the above-described evaluation results, it can be understood that the crystallographic orientation of the (111) face of the Al alloy film was comparatively strong when either the α-phase Ta film or the α-phase Ta/TaN laminated structure was arranged as the underlayer of the Al alloy film. It is considered that a wiring, including such an Al alloy film, has a high electromigration resistance.

The method for forming the Al alloy wiring according to the first embodiment of the present invention will now be described with reference to FIGS. 2A and 2B.

As illustrated in FIG. 2A, an $SiO_2$ film 2 having a thickness of 800 nm is formed by CVD on a surface of the silicon substrate 1. A TaN film 3 having a thickness of 10 nm, an α-phase Ta film 4 having a thickness of 20 nm, an Al alloy film 5 having a thickness of 400 nm and a TaN film 6 having a thickness of 50 nm are formed on the $SiO_2$ film 2. The TaN film 3, the α-phase Ta film 4 and the Al alloy film 5 are formed in the manner explained previously with reference to FIG. 1. The TaN film 3 may have a thickness between 1 nm and 20 nm. Furthermore, the α-phase Ta film 4 may have a thickness between 5 nm to 30 nm.

The TaN film 6 on the Al alloy film 5 serves as an antireflection film during exposure in a photolithographic process. The TaN film 6 is formed in the same manner as that in which the underlying TaN film 4 is formed.

Figure 2B:
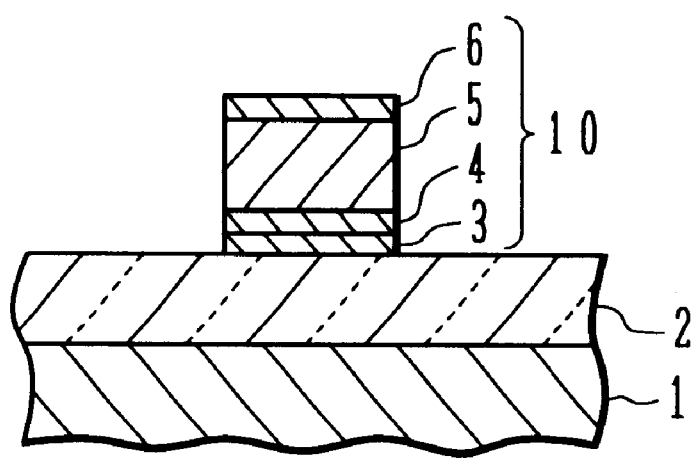

As illustrated in FIG. 2B, a lamination of the TaN film 6, the Al alloy film 5, the α-phase Ta film 4 and the TaN film 3 is subjected to patterning in order to leave a wiring 10. The patterning of the Al alloy film 5 is performed by the reactive ion etching (RIE) employing $Cl_2$ and $BCl_3$. The patterning of the TaN films 3 and 6 and the Ta film 4 is performed by the milling employing Ar ions.

According to the structure illustrated in FIG. 2B, the Al alloy film 5 is formed on the TaN film 3 and the α-phase Ta film 4. Consequently, as shown in FIG. 1, the (111) face of the Al alloy film 5 has a strong crystallographic orientation, which ensures a high electromigration resistance to the wiring 10.

In the first embodiment, two films, that is, the TaN film 3 and the α-phase Ta film 4, are arranged under the Al alloy film 5. However, even in the case where no TaN film is arranged under the Al alloy film 5 and only the α-phase Ta film is arranged under the Al alloy film 5, the strong crystallographic orientation of the (111) face of the Al alloy film can be attained. The TaN film 3 illustrated in FIGS. 2A and 2B may not be arranged also in the first embodiment, and the a-phase Ta film 4 may be formed directly on the $SiO_2$ film 2.

The method for forming the Al alloy wiring according to the second embodiment of the present invention will now be described with reference to FIGS. 3A to 3C.

Figure 3A:
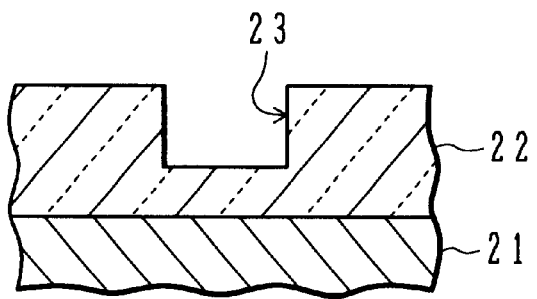
FIGS. 3A to 3C are diagrams illustrating cross sections of a wiring layer for the explanation of a method for manufacturing a wiring structure according to the second embodiment of the present invention.

As illustrated in FIG. 3A, an $SiO_2$ film 22 having a thickness of 800 nm is formed by CVD on a surface of a silicon substrate 21. A trench having a depth of 420 nm is formed in the $SiO_2$ film 22 by the RIE employing $CF_4$ and $CHF_3$.

Figure 3B:
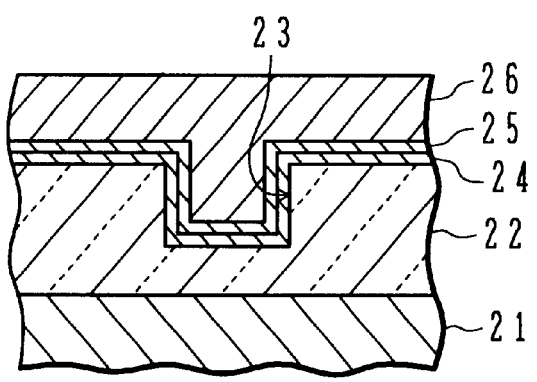

As illustrated in FIG. 3B, a TaN film 24, an α-phase Ta film 25 and an Al alloy film 26 are formed on the surface of the $SiO_2$ film 22 which includes the inner surface of the trench 23. Those films are formed in the same manner as that in which the TaN film 3, the a-phase Ta film 4 and the Al alloy film 5 are formed. The Al alloy film 26, the Ta film 25 and the TaN film 24 are polished by CMP (Chemical Mechanical Polishing). The polishing is halted at the time the upper surface of the $SiO_2$ film 22 appears.

Figure 3C:
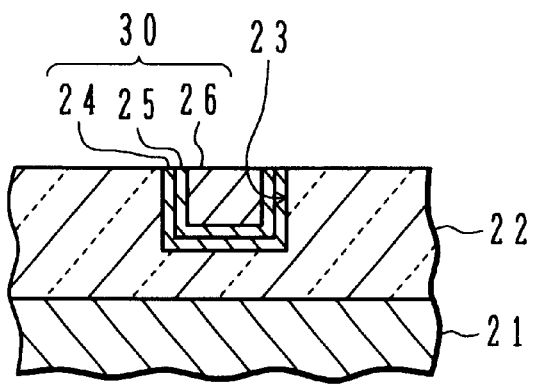

As illustrated in FIG. 3C, a wiring 30 which includes the TaN film 24, the Ta film 25 and the Al alloy film 26, is left in the trench 23. In the second embodiment, the crystallographic orientation of the (111) face of the Al alloy film 26 may be weaker than in the case of the first embodiment, due to the side walls of the trench 23 influencing the crystallographic orientation of the Al alloy film 26. Nevertheless, by virtue of the arrangement of the α-phase Ta film 25, the crystallographic orientation of the (111) face of the Al alloy film 26 is stronger than in the case of forming the Al alloy film on the TiN/Ti film, and the electromigration resistance is higher accordingly.

The third embodiment of the present invention will now be described with reference to FIGS. 4A to 4F.

Figure 4A:
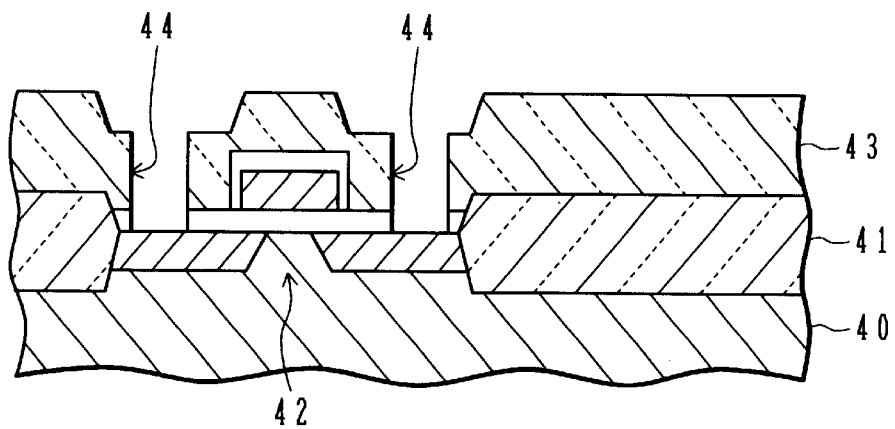
FIGS. 4A to 4F are diagrams illustrating cross sections of a substrate for the explanation of a method for manufacturing a semiconductor device according to the third embodiment of the present invention.

As illustrated in FIG. 4A, field oxide films 41 are formed on a surface of the silicon substrate 40, and a MOSFET 42 is formed in an active region defined by the field oxide films 41. A first interlayer insulation film 43, which is made of $SiO_2$, is formed on the substrate so as to cover the MOSFET 42. Contact holes 44, which extend through the interlayer insulation film 43, are formed in regions corresponding to the source/drain regions of the MOSFET 42.

Figure 4B:
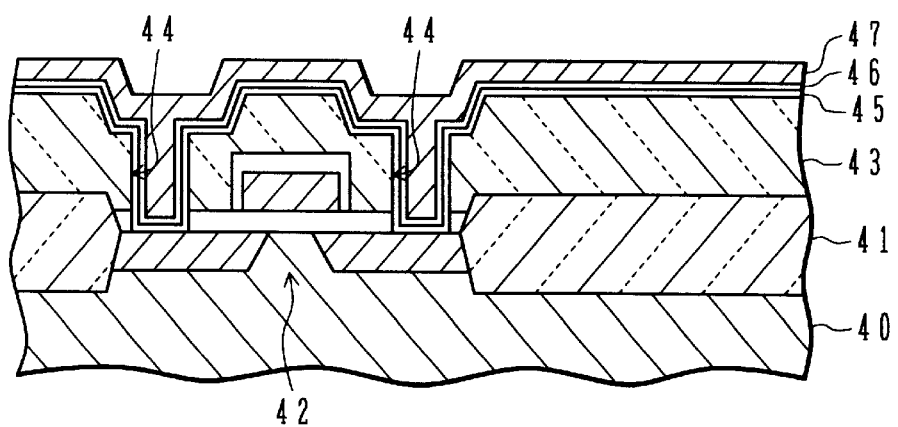

As illustrated in FIG. 4B, a TaN film 45 and an a-phase Ta film 46 are formed on the inner surfaces of the contact holes 44, as well as on the surface of the interlayer insulation film 43. An Al alloy film 47 is formed on the surface of the Ta film 46 so as to fill the contact holes 44. The TaN film 45, the Ta film 46 and the Al alloy film 47 are formed in the same manner as that in the case of FIG. 2A of the first embodiment. An antireflection film which is made of TaN may be formed on the Al alloy film 47, as illustrated in FIG. 2A.

Figure 4C:
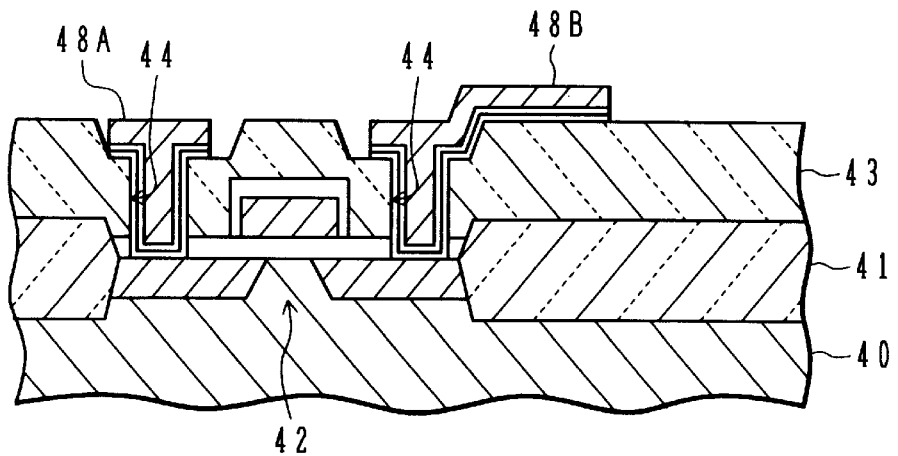

As illustrated in FIG. 4C, three films, that is, the TaN film 45, the Ta film 46 and the Al alloy film 47, are subjected to patterning in order to leave first level wirings 48A and 48B connected to the source/drain regions of the MOSFET 42, respectively. The patterning of those films is performed in the same manner as that in the case of FIG. 2B of the first embodiment.

Figure 4D:
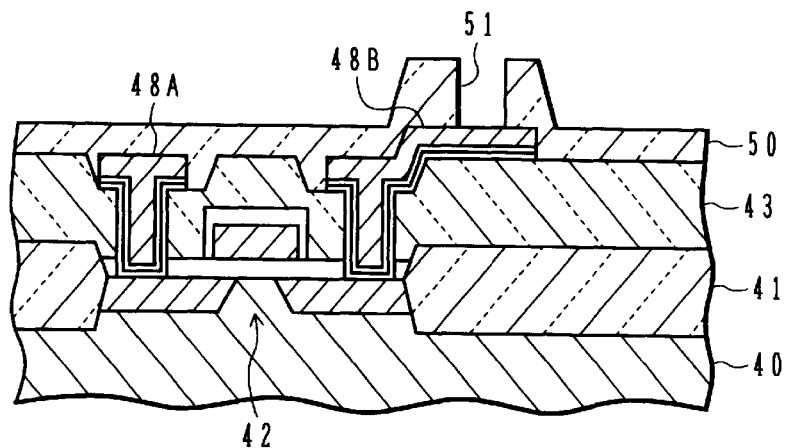

As illustrated in FIG. 4D, a second interlayer insulation film 50 is formed on the interlayer insulation film 43. A contact hole 51, which extends through the interlayer insulation film 50, is formed to expose a part of the wiring 48B.

Figure 4E:
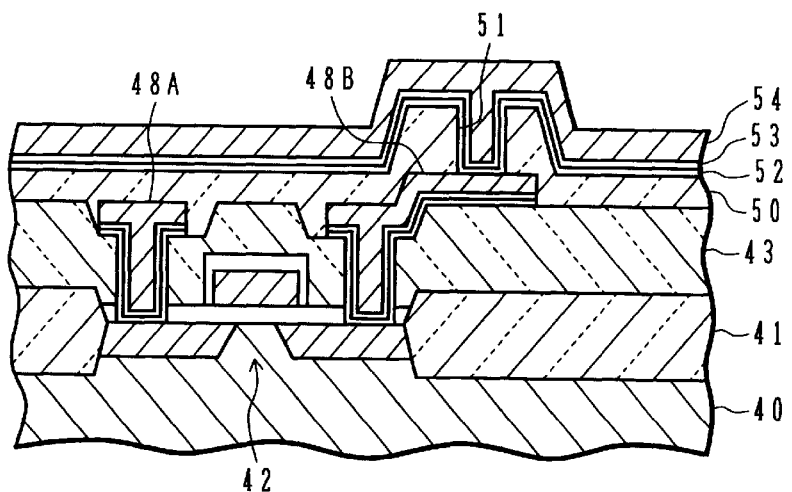

As illustrated in FIG. 4E, a TaN film 52 and an a-phase Ta film 53 are formed so as to cover the inner surface of the contact hole 51 and the surface of the interlayer insulation film 50. An Al alloy film 54 is formed on the surface of the Ta film 53 so as to fill the contact hole 51. The TaN film 52, the Ta film 53 and the Al alloy film 54 are formed in the same manner as that in the case of FIG. 2A of the first embodiment.

Figure 4F:
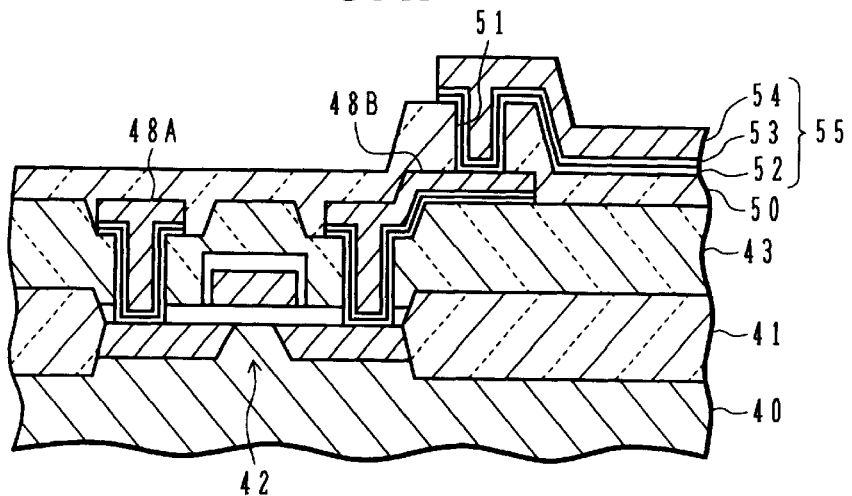

As illustrated in FIG. 4F, three films, that is, the TaN film 52, the Ta film 53 and the Al alloy film 54, are subjected to patterning in order to leave a second level wiring 55. The patterning of those films is conducted in the same manner as that in the case of FIG. 2B of the first embodiment. The wiring 55 is connected to another semiconductor element which is not illustrated in FIG. 4F.

The electromigration resistances of the wirings 48A, 48B and 55 are improved also in the case of the third embodiment. Due to those wirings having the improved electromigration resistances, the wiring thickness can be reduced. If the wiring thickness is reduced, a parasitic capacitance between two adjacent wirings in the same wiring layer, for example, the wirings 48A and 48B, can be reduced.

The present invention has been explained in the above with reference to the embodiments. However, the present invention is not limited thereto. For example, various modifications, improvements, combinations, etc. are possible, as should be apparent to a person skilled in the art.

What is claimed is:

1. A semiconductor device comprising:
   a semiconductor substrate;
   an insulation film formed on said semiconductor substrate; and
   a wiring formed on a part of a surface area of said insulation film and including a first conductive layer, which is made of Ta in an a phase, and a second conductive layer arranged on said first conductive layer and being made of an Al alloy.

2. The semiconductor device according to claim 1, further comprising:
   a semiconductor element formed on a surface of said semiconductor substrate;
   a contact hole extending through said insulation film and having a bottom which is defined by a part of said semiconductor element; and
   a conductive member filling said contact hole and connected to said part of said semiconductor element;
   wherein said wiring is electrically connected to said part of said semiconductor element via said conductive member.

3. The semiconductor device according to claim 1, wherein said wiring further includes a TaN film arranged under said first conductive layer.

4. The semiconductor device according to claim 2, wherein said conductive member includes:
   a first portion arranged on an inner surface of said contact hole and being made of a same material as that of said conductive layer; and
   a second portion covering a surface of said first portion, filling said contact hole and being made of a same material as that of said second conductive layer.

5. The semiconductor device according to claim 1, further comprising:
   another insulation film arranged over said insulation film;
   another wiring arranged on said another insulation film; and
   another contact hole formed in said another insulation film and having a bottom which is defined by a part of said another wiring;
   wherein said wiring is connected to said another wiring through said another contact hole.

6. The semiconductor device according to claim 1, wherein said second conductive layer has a strong crystallographic orientation of (111) face.

7. The semiconductor device according to claim 1, wherein said wiring has a laminated structure comprising said first conductive layer and said second conductive layer.

8. The semiconductor device according to claim 7, wherein said wiring further comprises a TaN layer under said first conductive layer.

9. The semiconductor device according to claim 7, wherein said wiring further comprises a TaN layer on said second conductive layer.

10. A semiconductor device comprising:
    a semiconductor substrate;
    an insulation film formed on said semiconductor substrate;
    a trench formed in said insulation film; and a wiring which buries said trench, said wiring comprising a first conductive layer, which is made of Ta in an α phase and covers an inner surface of said trench, and a second conductive layer, which is made of Al alloy and formed on said first conductive layer.

11. The semiconductor device according to claim 10, wherein said second conductive layer has a strong crystallographic orientation of (111) face.

12. The semiconductor device according to claim 11, wherein said wiring further comprises a TaN layer between said first conductive layer and said inner surface of said trench.

* * * * *